(12) United States Patent
Soda et al.

(10) Patent No.: US 7,439,171 B2
(45) Date of Patent: Oct. 21, 2008

(54) METHOD FOR MANUFACTURING ELECTRONIC DEVICE

(75) Inventors: Eiichi Soda, Ibaraki (JP); Sachiko Yabe, Ibaraki (JP)

(73) Assignee: NEC Electronics Corporation, Kanagawa (JP)

( * ) Notice: Subject to any disclaimer, the term of this patent is extended or adjusted under 35 U.S.C. 154(b) by 390 days.

(21) Appl. No.: 11/256,147

(22) Filed: Oct. 24, 2005

(65) Prior Publication Data

US 2006/0094234 A1 May 4, 2006

(30) Foreign Application Priority Data

Nov. 1, 2004 (JP) .............................. 2004-317719

(51) Int. Cl.
*H01L 21/4763* (2006.01)
(52) U.S. Cl. ................ 438/618; 438/597; 257/E21.579
(58) Field of Classification Search ................. 438/597, 438/618, 637, 639, 701; 257/758, E21.579
See application file for complete search history.

(56) References Cited

U.S. PATENT DOCUMENTS

| | | | | |
|---|---|---|---|---|
| 6,898,851 B2 * | 5/2005 | Nishioka et al. | ............... | 29/852 |
| 7,192,863 B2 * | 3/2007 | Zhijian et al. | ............... | 438/637 |
| 7,241,682 B2 * | 7/2007 | Ho et al. | ..................... | 438/637 |
| 2006/0094221 A1 * | 5/2006 | Soda et al. | .................. | 438/597 |

FOREIGN PATENT DOCUMENTS

JP      2004-221439      8/2004

\* cited by examiner

*Primary Examiner*—Phuc T Dang
(74) *Attorney, Agent, or Firm*—Young & Thompson

(57) ABSTRACT

A method for manufacturing an electronic device, in which a via hole and a trench for an interconnect are integrally provided in an interlayer insulating film formed on a substrate, and the via hole and the trench for the interconnect are plugged with an electric conductor film is provided. The method includes: forming a via hole in the interlayer insulating film; forming a resin film, plugging the via hole, on the interlayer insulating film; forming a resist mask having an opening for an interconnect on the interlayer insulating film; and etching the interlayer insulating film through an etching mask of the resist mask to form a trench for the interconnect connected with the via hole. The resin film is being capable of trapping a basic substance.

18 Claims, 10 Drawing Sheets

METHOD FOR MANUFACTURING ELECTRONIC DEVICE

This application is based on Japanese patent application NO. 2004-317,719, the content of which is incorporated hereinto by reference.

BACKGROUND

1. Technical Field

The present invention relates to a method for manufacturing an electronic device.

2. Related Art

In recent years, remarkably increasing processing speed of the semiconductor device leads to a problem of generating a transmission delay due to a decrease in a signal propagation rate, which is caused by an interconnect resistance in a multilayer interconnect and a parasitic capacitance between the interconnects. Such problem tends to become more and more considerable, due to an increased interconnect resistance and an increased parasitic capacitance, which are caused in accordance with miniaturizations of a linewidth and an interconnect interval created by an increased integration of the semiconductor device. Consequently, in order to prevent a signal delay caused on the basis of enhancements in the interconnect resistance and in the parasitic capacitance, it has been attempted that a copper interconnect is introduced as a substitute for the conventional aluminum interconnect, and a low dielectric constant film (hereinafter referred to as "low-k film") is employed for an interlayer insulation film. Here, the low dielectric constant film may be an insulating film having a relative dielectric constant lower than a relative dielectric constant of a silicon dioxide ($SiO_2$) film of 3.9.

A damascene process is a process for forming the above-described copper interconnect. This is a technology of forming the interconnects without etching Cu, in view of the fact that control of the etch rate for copper (Cu) is difficult as compared with aluminum (Al), or more specifically, this is a damascene interconnect (trench interconnect) technology, in which trenches for interconnects (trenches) or connection apertures (via holes) are formed in an interlayer insulating film via a dry etching process and then such trenches or via holes are filled with Cu or Cu alloy.

In so-called dual damascene interconnect technology, in which trenches (trenches for dual damascene interconnects) formed by connecting the above-described trench with the via holes are provided in the above-described interlayer insulating film and then the trenches and via holes are integrally plugged with an interconnect material film, various types of formation processes are energetically developed toward the practical use thereof. Such process for forming the dual damascene interconnect can be roughly classified into a via first process, a trench first process and a dual hard masking process, depending on differences in the process for forming a trench for the above-described dual damascene interconnect. In these processes, the via first process and the trench first process commonly involve forming trenches for dual damascene interconnects via a dry etching process of the interlayer insulating film employing a resist mask. The via first process further involves, at first, forming via holes, and then forming trenches, and the trench first process further involves, inversely, at first, forming trenches, and then forming via holes. On the contrary, the above-described dual hard masking process involves collectively forming the trenches for dual damascene interconnects via a dry etching process of the interlayer insulating film employing a hard mask.

Amongst the above-described dual damascene interconnect technologies, the above-described via first process has the following benefits, as compared with other processes. That is, compatibility thereof with the single damascene process is higher and thus a conversion thereto is easier in the photolithography process and the dry etching process, and a reduction of leakage current between the damascene interconnects is facilitated. Accordingly, as discussed later, investigations on the above-described via first process aiming for providing the practical use, such as an investigation for providing a solution to the resist poisoning phenomenon that is required for a miniaturization of interconnect pattern, are widely carried out in recent days (see, for example, Japanese Laid-open patent publication No. 2004-221,439).

However, a resist poisoning phenomenon is occurred in a resist employed for forming a trench opening during an operation for forming the trench in the conventional via first process, and thus a problem of difficulties in forming the trench openings of the resist mask with higher minuteness and precision is arisen.

SUMMARY OF THE INVENTION

According to the present invention, there is provided a method for manufacturing an electronic device, in which a via hole and a trench for an interconnect are integrally provided in an interlayer insulating film formed on a substrate, and the via hole and the trench for the interconnect are plugged with an electric conductor film. The method includes: forming a via hole in the interlayer insulating film; forming a resin film on the interlayer insulating film, the resin film plugging the via hole, and being capable of trapping a basic substance; forming a resist mask having an opening for an interconnect on the interlayer insulating film; and etching the interlayer insulating film through an etching mask of the resist mask to form a trench for the interconnect, the trench being connected with the via hole.

According to the present invention, there is provided a method for manufacturing an electronic device, in which a via hole and a trench for an interconnect are integrally provided in an interlayer insulating film formed on a substrate, and the via hole and the trench for the interconnect are plugged with an electric conductor film. The method includes: forming a via hole in the interlayer insulating film; forming a resin film on the interlayer insulating film, the resin film plugging the via hole, and containing cellulose; forming a resist mask having an opening for an interconnect on the interlayer insulating film; and etching the interlayer insulating film through an etching mask of the resist mask to form a trench for the interconnect, the trench being connected with the via hole.

According to the configuration of the present invention, the resist poisoning can be inhibited in the formation of the resist mask having openings arranged in an interconnect pattern, and a pattern-collapse of above-described resist mask can be prevented, so that a trench for a dual damascene interconnect having a fine structure and an improved quality and a dual damascene interconnect formed by plugging thereof with an interconnect material film can be formed with an improved controllability. Further, production yield for the electronic device comprising the dual damascene interconnect can be improved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The present inventors have conducted various investigation concerning the process for forming the dual damascene interconnect employing a via first process. More specifically, the present inventors have involved detailed investigations for each process operations in the process for forming a dual damascene interconnect. As a result, it is found that a basic substance such as ammonia ($NH_3$) gas or hydrazine ($N_2H_4$) gas employed in the formation process deactivates an acid generation agent of a chemically amplified resist, and thus is greatly participated in the above-described resist poisoning phenomenon.

Further, the present inventors have also found that the resist poisoning phenomenon can be effectively inhibited by suitably selecting a material of the dummy plug for plugging in the via hole before forming the trench. The present inventors have further found that the resist poisoning phenomenon can also be effectively inhibited by employing a material capturing or trapping a basic substance, as such material of the dummy plug. Moreover, the present inventors have also found that the above-described inhibiting effect can be increased by composing the dummy plug with organic cellulose as a basic material thereof, and the resist pattern-collapse can be considerably reduced even though a fine configuration is employed. The present invention is presented on the basis of these new discoveries.

Preferred embodiments of the present invention will be described as follows in reference to the annexed figures. A procedure for forming a dual damascene interconnect by the via first process will be described in reference to FIGS. 2A to 2C and FIGS. 4A to 4C. FIGS. 2A to 2C and FIGS. 4A to 4C are cross-sectional views of the device for describing respective operations for forming the dual damascene interconnect by the via first process.

Figure 2A:
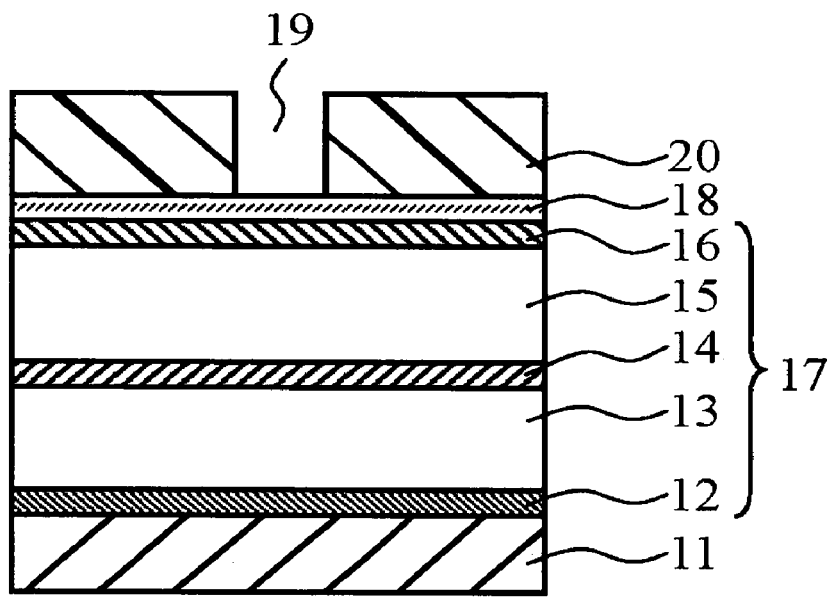
FIGS. 2A to 2C are cross-sectional views of a semiconductor device, illustrating a formation process for a dual damascene interconnect according to an embodiment of the present invention.

First, as shown in FIG. 2A, a via etch stop layer 12 is deposited on an underlying interconnect 11. The underlying interconnect 11 may be a copper interconnect. The via etch stop layer 12 functions as an insulating barrier layer that will work as a Cu diffusion barrier film. The via etch stop layer 12 may be composed of, for example, silicon carbonitride (SiCN) film or silicon carbide (SiC) film. The film thickness of the via etch stop layer 12 may be, for example, on the order of 20 nm.

Subsequently, a first low dielectric constant film 13, a trench etch stop layer 14, a second low dielectric constant film 15 and a cap layer 16 are deposited to appropriate film thickness on the via etch stop layer 12.

The first low dielectric constant film 13 and the second low dielectric constant film 15 may be composed of a low-k film having a relative dielectric constant of, for example, equal to or less than 3. The low-k film may be composed of, for example, carbon-containing silicon oxide film (SiOC film), methyl silsesquioxane (MSQ) film or the like. The SiOC film may be deposited via, for example, a chemical vapor deposition (CVD). The MSQ film may be formed via a coating process, for example. The constitution of the MSQ film may be formulated to be, for example, $[CH_3SiO_{3/2}]_n$.

Further, the Low-k film may also be composed of, for example, a porosified insulating film such as a porous MSQ film (p-MSQ film) and the like. This can provide a reduced relative dielectric constant of the low-k film, and the relative dielectric constant may be, for example, equal to or less than 2.5.

The trench etch stop layer 14 may be at least an insulating film, which is a different type from the second low dielectric constant film 15 or the via etch stop layer 12. The trench etch stop layer 14 may be composed of, for example, SiC film, SiCN film, SiOC film, silicon nitride (SiN) film or the like.

The cap layer 16 may be composed of $SiO_2$ film or the like. Alternatively, in another case, the electronic device may have a configuration that does not include cap layer 16.

As described above, the interlayer insulating film 17 having the multiple-layered insulating film structure including the via etch stop layer 12, the first low dielectric constant film 13, the trench etch stop layer 14, the second low dielectric constant film 15 and the cap layer 16 is formed.

Next, a first anti-reflection film 18 is formed on the surface of the cap layer 16. Thereafter, a first resist mask 20 having a via opening 19 is formed on the first anti-reflection film 18 via a photolithographic technology.

Figure 2B:
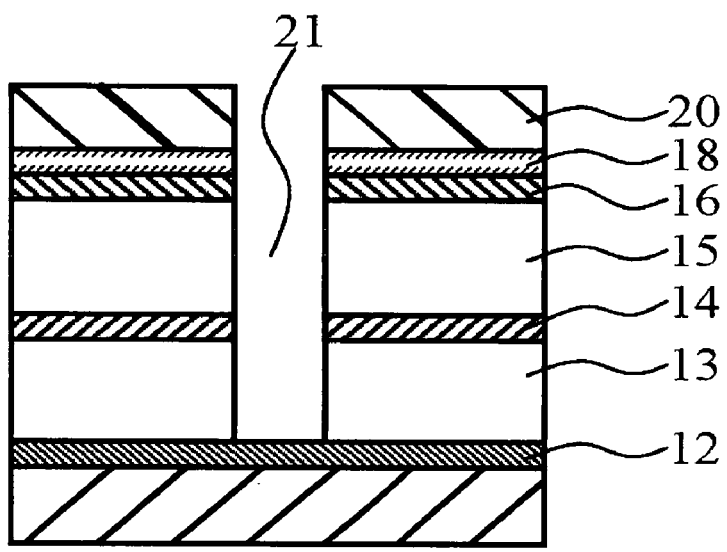

Subsequently, as shown in FIG. 2B, the first anti-reflection film 18, the cap layer 16, the second low dielectric constant film 15, the trench etch stop layer 14 and the first low dielectric constant film 13 are sequentially dry etched via a reactive ion etching (RIE) through the first resist mask 20 as a mask for the dry etching process to form a via hole 21. The via hole 21 is formed so as to extend through the multiple-layered insulating film comprising the above-described films to reach the surface of the via etch stop layer 12. At this time, the via etch stop layer 12 is not etched.

Next, the first resist mask 20 and the first anti-reflection film 18 are removed via an ashing process, and then are cleaned with a chemical solution.

Figure 2C:
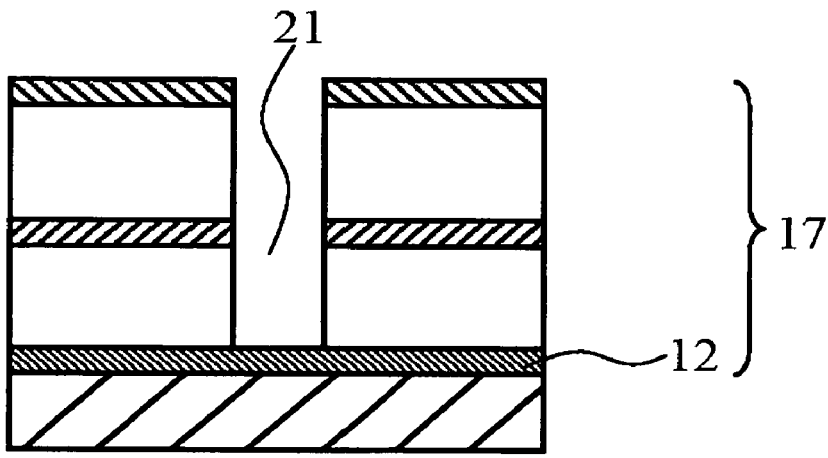

The via hole 21 extending to the surface of the via etch stop layer 12 of the interlayer insulating film 17 is formed by this operation, as shown in FIG. 2C.

Figure 3A:
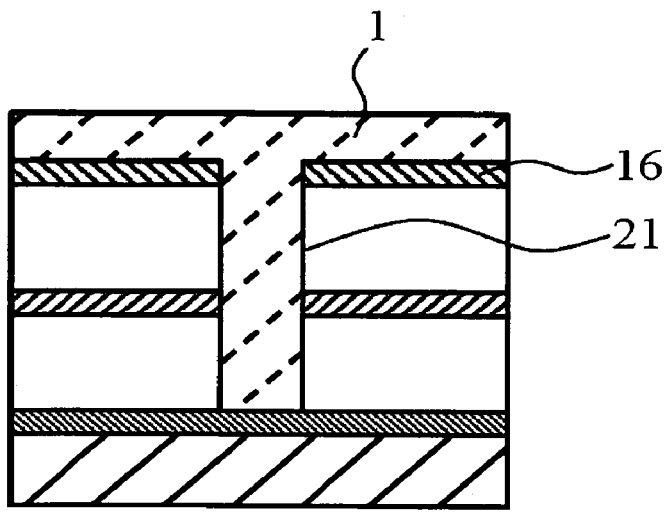
FIGS. 3A to 3C are cross-sectional views of a semiconductor device, illustrating a formation process for a dual damascene interconnect according to an embodiment of the present invention.

Then, as shown in FIG. 3A, a resin film 1 is formed to cover the cap layer 16 and plug the via hole 21. Materials and forming processes available for composing the resin film 1 will be discussed later.

Figure 3B:
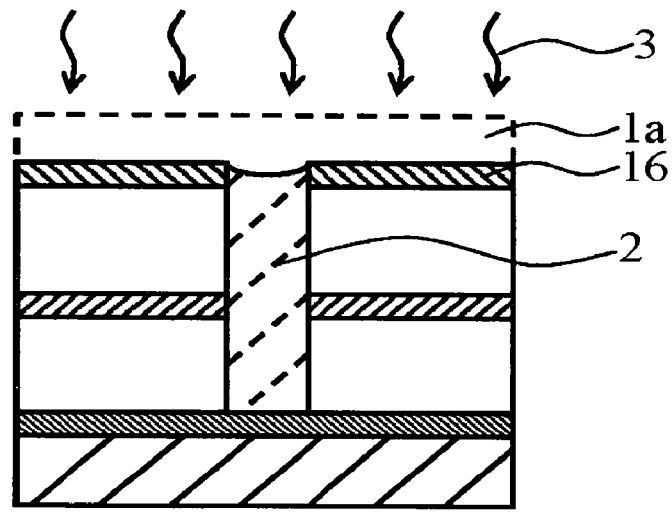

Next, as shown in FIG. 3B, the resin film 1a existing on the surface of the cap layer 16 exposed outside of the via hole 21 is removed by an etch back process to form a dummy plug 2 composed of the resin film 1 in the via hole 21. This provides the dummy plug 2 that plugs the via hole 21.

Figure 3C:
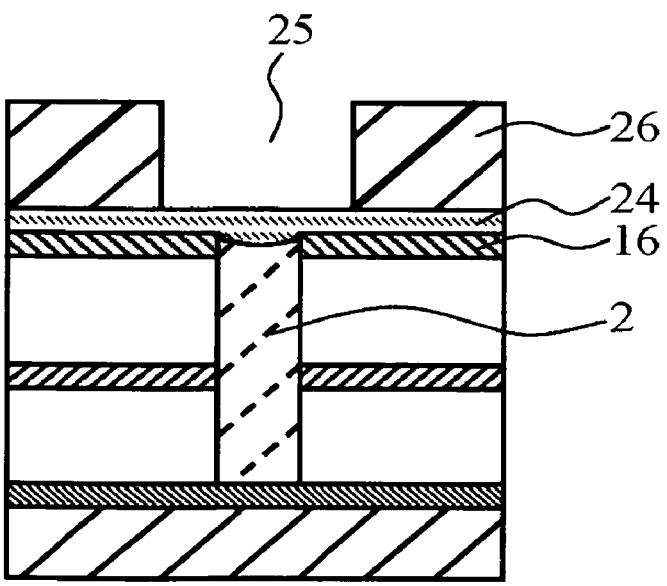

Next, as shown in FIG. 3C, the second anti-reflection film 24 is formed to coat the surfaces of the cap layer 16 and the dummy plug 2. Subsequently, a second resist mask 26 having a trench opening 25 is formed on the second anti-reflection film 24 by a photolithographic technology. The second resist mask 26 may be a chemically amplified resist.

Figure 4A:
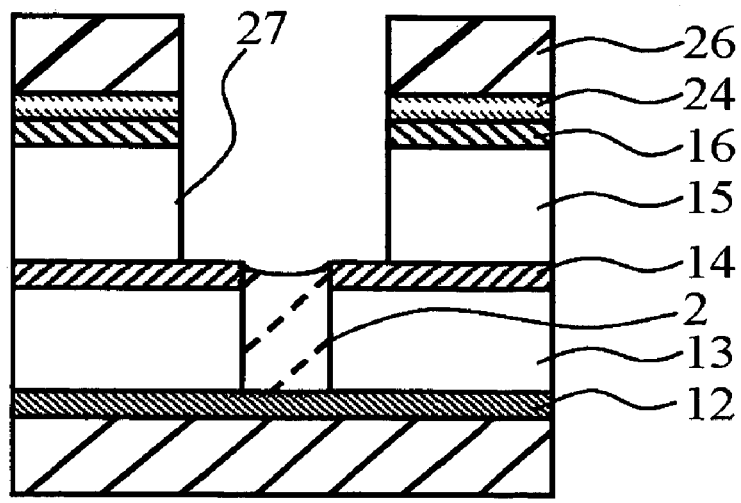
FIGS. 4A to 4C are cross-sectional views of a semiconductor device, illustrating a formation process for a dual damascene interconnect according to an embodiment of the present invention.

Then, as shown in FIG. 4A, the second anti-reflection film 24, the cap layer 16 and the second low dielectric constant film 15 are dry etched by RIE through a dry etching mask of the second resist mask 26. In this case, the dummy plug 2 provides a protection of the via etch stop layer 12 from a damage caused by the above-described RIE, and the first trench etch stop layer 14 provides a protection of the low dielectric constant film 13 from a damage caused by the above-described RIE. In this way, the trench 27 of the interconnect pattern is formed.

Figure 4B:
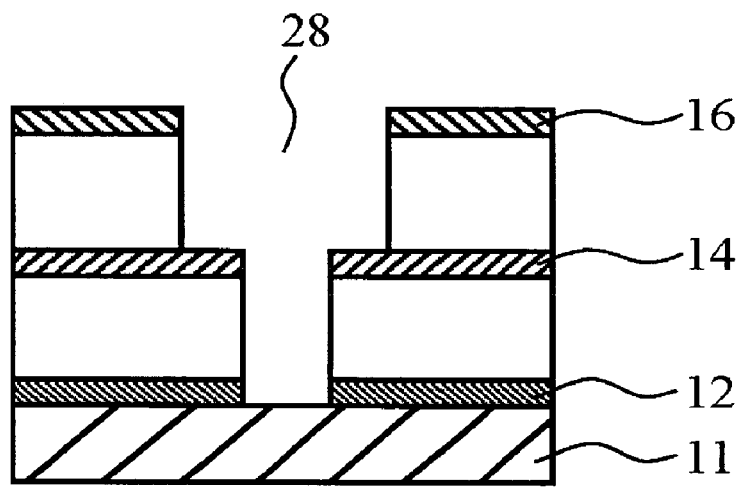

Next, as shown in FIG. 4B, the second resist mask 26, the second anti-reflection film 24 and the dummy plug 2 are removed by an ashing process. Subsequently, the exposed via etch stop layer 12 is dry etched by an dry etching process employing a hard mask of the cap layer 16 and the trench etch stop layer 14. Having this procedure, the trench 28 for the dual damascene interconnect, which reaches the surface of the underlying interconnect 11, is formed. Then, a cleaning process with a liquid chemical solution is conducted to remove residues. In this case, the liquid chemical solution may be a type of chemical solution that does not oxidize the exposed surface of the underlying interconnect 11.

Figure 4C:
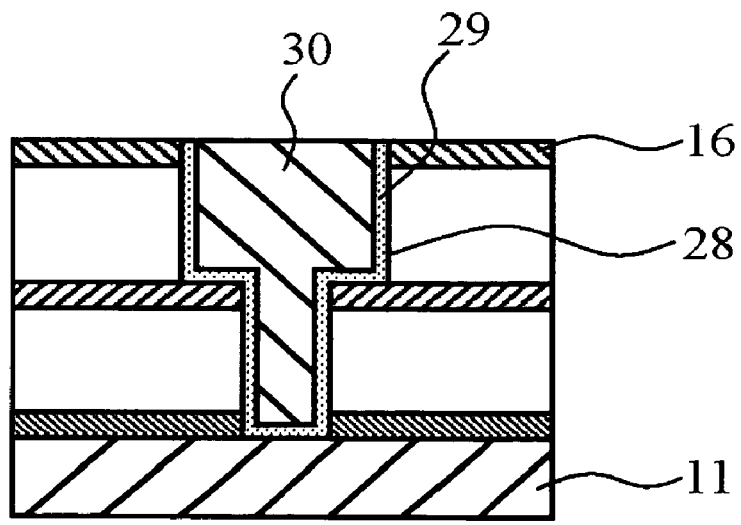

Next, as shown in FIG. 4C, a barrier metal such as tantalum nitride (TaN) and the like is deposited via a sputtering process or an atomic layer deposition (ALD) process. Subsequently, a formation of a Cu seed and a metal plating of Cu are conducted to form an interconnect material film. Then, an unwanted portion of the interconnect material film on the surface of the cap layer 16 is polished to be removed via a chemical mechanical polishing (CMP). In this way, an electroconductive barrier layer 29 that is coupled to the underlying interconnect 11 and functions as a Cu diffusion barrier film and a dual damascene interconnect 30 that is wrapped by the barrier layer 29 are formed in the above-described trench 28 for the dual damascene interconnect.

Figure 5A:
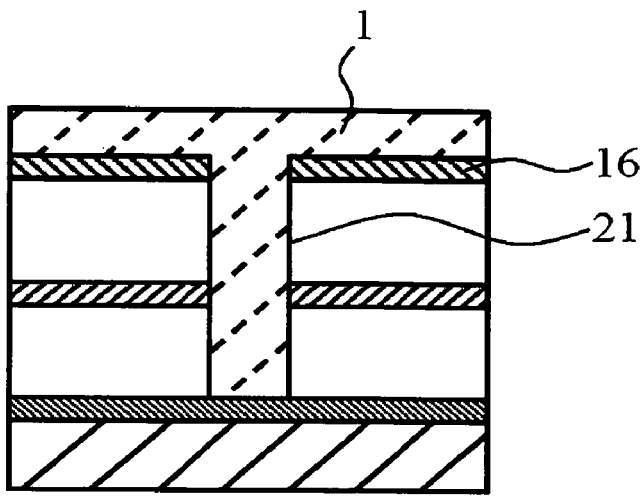
FIGS. 5A to 5C are cross-sectional views of a semiconductor device, illustrating a formation process for a dual damascene interconnect according to an embodiment of the present invention.
Figure 5B:
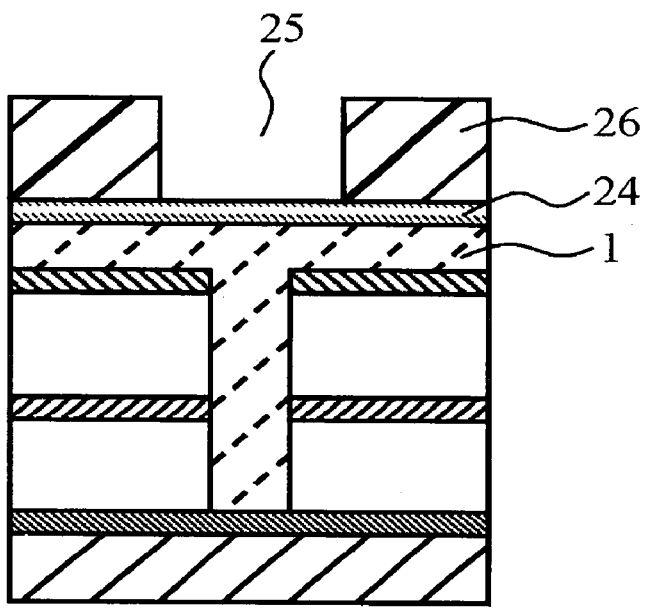
Figure 5C:
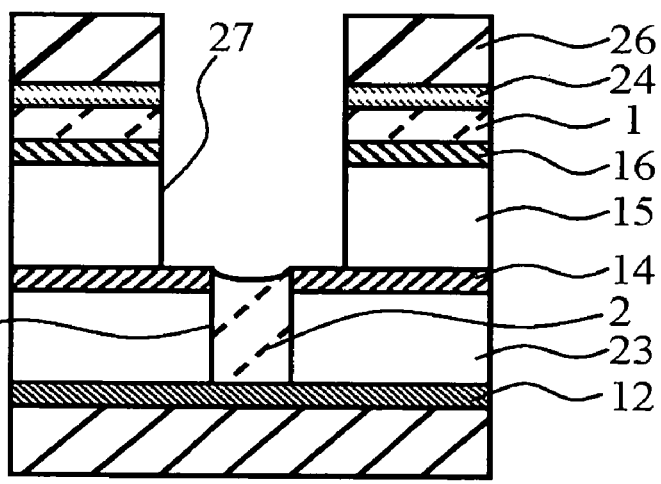

FIGS. 5A to 5C are process cross-sectional views, illustrating an alternative procedure shown in FIG. 3C from FIG. 3A.

In this case, the etchback process of FIG. 3B may be eliminated, so that the resin film 1a on the cap layer 16 is remained.

The process shown in FIG. 5A may be conducted in a similar process as illustrated in FIG. 3A. Next, as shown in FIG. 5B, a second anti-reflection film 24 is formed on the resin film 1. Subsequently, a second resist mask 26 having a trench opening 25 is formed on the second anti-reflection film 24 by a photolithographic technology. Then, similarly as described in reference to FIG. 4A, the second first anti-reflection film 24, the resin film 1, the cap layer 16 and the second low dielectric constant film 15 are sequentially dry etched via a reactive ion etching (RIE) through the second resist mask 26 as a mask for the dry etching process, as shown in FIG. 5C. In this case, the dummy plug 2 provides a protection of the via etch stop layer 12 from a damage caused by the above-described RIE, and the first trench etch stop layer 14 provides a protection of the low dielectric constant film 13 from a damage caused by the above-described RIE. In this way, the trench 27 of the interconnect pattern is formed.

Here, when the film having a function of an anti-reflection film is employed for the resin film 1, similar process as described above may be conducted and the formation process for the second anti-reflection film 24 may be eliminated.

Next, a process for manufacturing the above-described electronic device will be sorted out and be fully described as follows.

(Formation of Resin Film 1)

The resin film 1 shown in FIG. 3A may be composed of a material having function of capturing or trapping a basic substance such as, for example, amine or the like.

Figure 1:
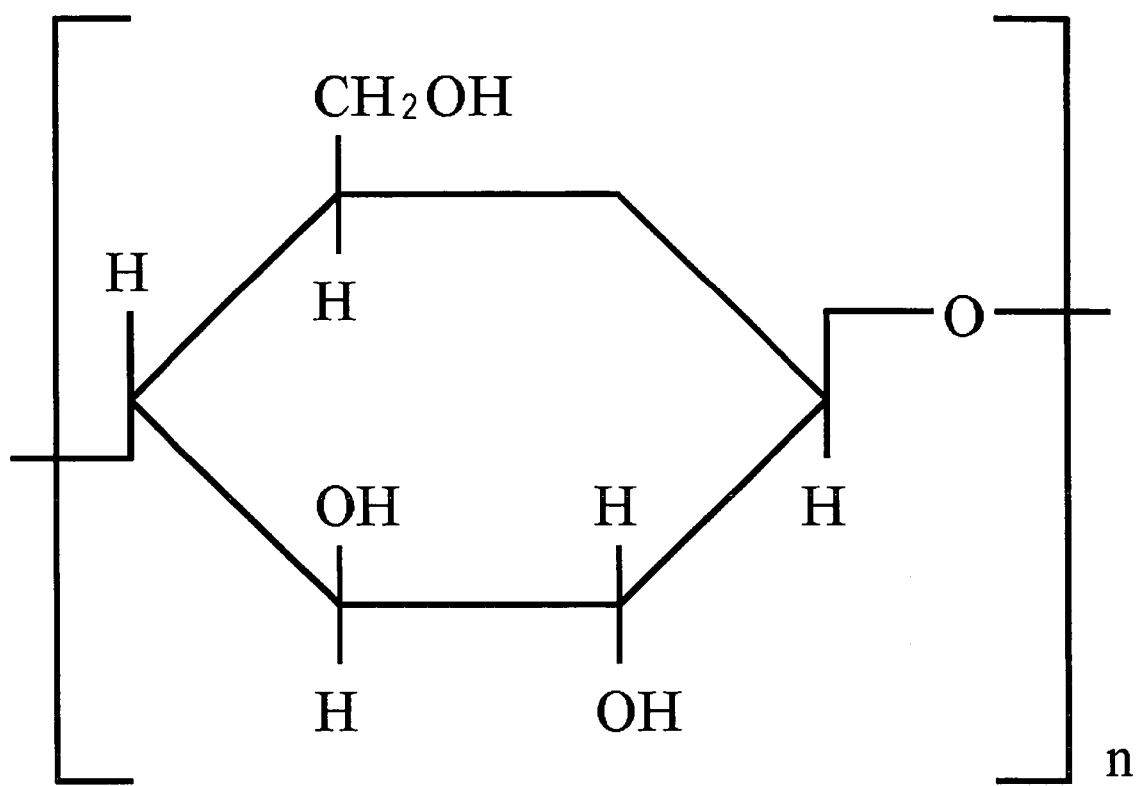
FIG. 1 is a chemical structural formula of cellulose employed for forming a dummy plug of an embodiment of the present invention.

The resin film 1 may be composed of, for example, a cellulosic resin containing cellulose having chemical structure shown in FIG. 1 as a constitutional material. Cellulose has a chemical formula of $(C_6H_7O_2(OH)_3)_n$, and is an organic polymer that is formed by a chain polymerization. The resin film 1 may contain the above-described cellulose as a basic material, and may be formed by mixing the above-described cellulose in a portion of another type of organic polymer having thermosetting property such as phenolic resin and the like. A resin mixture formed by mixing, for example, cellulose with phenolic resin at a suitable ratio may be employed for the resin film 1.

As indicated in chemical formula of FIG. 1, hydroxyl group (OH—) is included in cellulose molecule at higher ratio. Thus, various types of basic substances such as amine and the like and water can easily be adsorbed therein via hydrogen bond. Therefore, the basic substances and water can be trapped in the dummy plug 2 that includes the resin film 1. Having such procedure, basic substances generated in the process for manufacturing the electronic device such as amine, $NH_3$, $NH_2$, NH and the like are trapped by the dummy plug 2. Therefore, the resist poisoning phenomenon is considerably inhibited in the process for forming the second resist mask 26. Further, even when water is adhered to the surface of the resin film 1 in the photolithographic process, the resin film 1 can absorb such water, and thus adhesiveness with the second resist mask 26, which exhibits a hydrophobicity can be enhanced. This can prevents the resist collapse of the second resist mask 26.

When the resin film 1 is composed of a cellulosic resin, the resin film 1 may be formed on the substrate via a spin coating, and then is thermally treated within an atmosphere of inert gas or inactive gas (nitrogen gas or inert gas). The thermal processing temperature may be within a range of from 150 to 250 degree C., which is a baking temperature for carbonization of cellulose. Cellulose in the resin film 1 partially becomes a carbide by the thermal processing at such temperature. Ability for adsorbing basic substance and water of the resin film 1 can be further enhanced by the presence of carbide in the resin film 1. Further, carbide in the resin film 1 can acquire a slight acidity by selecting such baking temperature. Having such configuration, the resin film 1 neutralize the basic substance that has been adsorbed via an acid-base reaction to dissipate the basic substances themselves.

In addition, an acidic agent may be added to the resin film 1 to promote such acid-base reaction. In this case, a quantity of added acidic agent can be adjusted corresponding to a quantity of basic substance generated in the process for forming the dual damascene interconnect. This can provide a reduction of occurring the resist poisoning phenomenon. Typical acidic agents available in this case may include, for example, a Broensted acid (proton acid) such as acetic acid, hydrochloric acid, sulfuric acid and the like, or a Lewis acid such as methyl acetate, proton, nitric monoxide ion and the like.

After the process shown in FIG. 2C, the resin film 1 that is capable of trapping the basic substance is applied on the cap layer 16 via a spin coating process so as to fill the via hole 21 therewith, as shown in FIG. 3A. Hereafter, the resin film 1 is cured and baked to carbonize at a temperature of 150 to 250 degree C. to form the resin film 1.

(Formation of Dummy Plug 2)

In the etchback process for the resin film 1 shown in FIG. 3B, active hydrogen species 3 is applied over the resin film 1 to etch the resin film 1a on the cap layer 16 off, thereby forming the dummy plug 2 in the via hole 21. The active hydrogen species 3 is a hydrogen ($H_2$) in an excited state, and may be selected from hydrogen atom ion (proton), hydrogen molecular ion and neutral hydrogen radical. The active hydrogen species 3 may be generated by exciting hydrogen gas or a gaseous mixture thereof with an inert gas (noble gas) via radio frequency (RF) plasma excitation, helicon wave plasma excitation, electron cyclotron resonance (ECR) plasma excitation, microwave plasma excitation, inductively coupled plasma (ICP) excitation or the like, or via photo-excitation. The inert gas may be He, Ar, Ne or the like. Generation of hydrogen radical may be carried out by employing so-called hydrogen gas-remote plasma generation apparatus or micro wave-downstream type plasma apparatus.

After the dummy plug 2 is formed in the via hole 21, the second anti-reflection film 24 and the second resist mask 26 are formed as shown in FIG. 3C. When a hydrogen plasma is employed as the active hydrogen species 3, a larger amount of $H^+$ (proton) may be introduced over the dummy plug 2. As a result, a similar advantageous effect as what obtained by adding the above-described acidic agent to the resin film 1 can be obtained to further enhance the trapping ability of dummy plug 2 for the basic substance.

Here, in the dry etching process for forming the trench 27 shown in FIG. 4A and FIG. 5C, unless the material composing the dummy plug 2 is suitably selected, unwanted crown-shaped fence could be formed along the upper portion of the circumference of the via hole 21 in the trench 27. It is considered that such fence is formed when the etch rate of material composing dummy plug 2 is lower than the etch rate of the second low dielectric constant film 15. When the etch rate for the dummy plug 2 is lower, a column-shaped portion of the dummy plug 2 is remained in the process for forming the trench 27. As a result, the low dielectric constant film, which can not be etched, is formed on the side wall of the dummy plug 2 as a side wall-insulating film to provide the fence.

When the resin film 1 is composed of a cellulosic resin as described above, the problem of creating such fence can be prevented. This is because a lower density of cellulosic resin generally provides an increased etch rate, and thus the etch rate can be controlled to a level similar to or higher than the etch rate for the low dielectric constant film.

Further, when the resin film 1 is composed of a cellulosic resin, a filling capability into the via hole 21 can be increased. Further, in such the case, influence of the coarseness and minuteness of the formed via hole is small, and thus uniform coating over the surface of the cap layer 16 in the processed substrate can be achieved. Therefore, even if the etch back process for the resin film 1 is not conducted (see FIGS. 5A to 5C), an improved process for forming the trench 27 can be conducted thereafter, thereby providing a simple process at higher controllability and higher accuracy.

(Formation of an Interlayer Insulating Film)

As for the first low dielectric constant film 13 and the second low dielectric constant film 15 that are the low dielectric constant film described in reference to FIGS. 2A to 2C, FIGS. 3A to 3C and FIGS. 4A to 4C, other insulating films having a siloxane backbone or an insulating film having a main backbone of an organic polymer, or an insulating film formed by porosifying thereof may be employed, in addition to the above-described SiOC film and MSQ film. The available insulating films having the above-described siloxane backbone may include a silica film containing at least one of Si—$CH_3$ bond, Si—H bond, and Si—F bond, which is an insulating film of silsesquioxane. Further, the available insulating materials for the insulating film of silsesquioxane include hydrogen silsesquioxane (HSQ), methylated hydrogen silsesquioxane (MHSQ) or the like. Further, SiOCH film deposited via a CVD may also similarly be employed. The available insulating films having the main backbone of the organic polymer may include "SiLK" (trademark of the Dow Chemical Company) consisting of an organic polymer or Aurora (trademark).

(etching of an interlayer insulating film via a dry etching process)

The via hole 21 and the trench 27 are formed via the dry etching process of the insulating films that include low dielectric constant films, respectively. Further, as for an etching gas employed in the RIE of the interlayer insulating film 17 for forming the via hole 21 in the operation shown in FIG. 2B, a fluorocarbon-containing gas of $CF_4/Ar/N_2$, for example, may be employed for the dry etching process for the first anti-reflection film 18, the cap layer 16, the second low dielectric constant film 15, the trench etch stop layer 14, and the first low dielectric constant film 13. In addition to these, as for the above-described etching gas, at least a source gas selected from the group consisting of fluorocarbon gases having a general formula of $C_xH_yF_z$ (where x, y, z are integer numbers that satisfy $X \geq 1$, $Y \geq 0$ and $Z \geq 1$) may be employed. Such fluorocarbon-containing gas may also be similarly employed for forming the trench 27 in the process shown in FIG. 5C that corresponds to the operation shown in FIG. 4A.

A protection to the side wall of the via hole or the trench can be easily conducted by employing fluorocarbon gas. In addition, fluorocarbon gas is particularly preferable in the case of employing a low dielectric constant film having a porous structure. In RIE process, an entering of fluorine radical created by exciting an etching gas into the interlayer insulating film through pores in the low dielectric constant film can be prevented. Thus, an interlayer insulating film having better quality and lower dielectric constant can be formed.

Further, having a configuration in which the resin film 1 is composed of a cellulosic resin and an etching gas containing a fluorocarbon is employed, it is possible to obtain a preferable advantageous effects. The fluorocarbon-containing gas has a tendency to reduce the etch rate for the resin material because it contains a large amount of carbon (C), and thus a problem of easily forming the fence as described above is arisen. However, when the resin film 1 is composed of the cellulosic resin, the etch rate for the resin film 1 can be increased even if a fluorocarbon-containing gas is employed, and thus the etch rate can be controlled to a level similar to or higher than the etch rate for an interlayer insulating film. Since cellulose contains oxygen at larger component ratio, oxygen composing cellulose is easily combined with carbon from the fluorocarbon-containing gas that is plasma-excited in the RIE process for forming the trench 27 to create CO, which is a reaction product having higher volatility, and thus the resin film 1 is easily removed via etching process. Having this procedure, the problem of generating a fence can be prevented while providing the protection for the side wall of the trench, thereby providing an improved formation of the trench.

Here, in the dry etching process by using a hard mask of the cap layer 16 in the process shown in FIG. 4B, a gaseous mixture of $CHF_3/Ar/N_2$, a gaseous mixture of $CF_4/Ar/N_2$ or the like may be employed for the etching gas. Such etching gas is plasma-excited to conduct a dry etching process of the via etch stop layer 12 to form the trench 28 for the dual damascene interconnect extending to the surface of the underlying interconnect 11.

Next, advantageous effects obtainable by employing the process for manufacturing the electronic device in the present embodiment will be described.

Here, an typical example of a generation of the resist poisoning phenomenon in a case of forming the second resist mask 26 by employing a chemically amplified positive resist in a photolithographic process will be described, in reference to FIGS. 9A and 9B. Here, the resin film 23 may be composed of an organic polymer having thermosetting property such as novolac resin and the like.

Figure 9A:
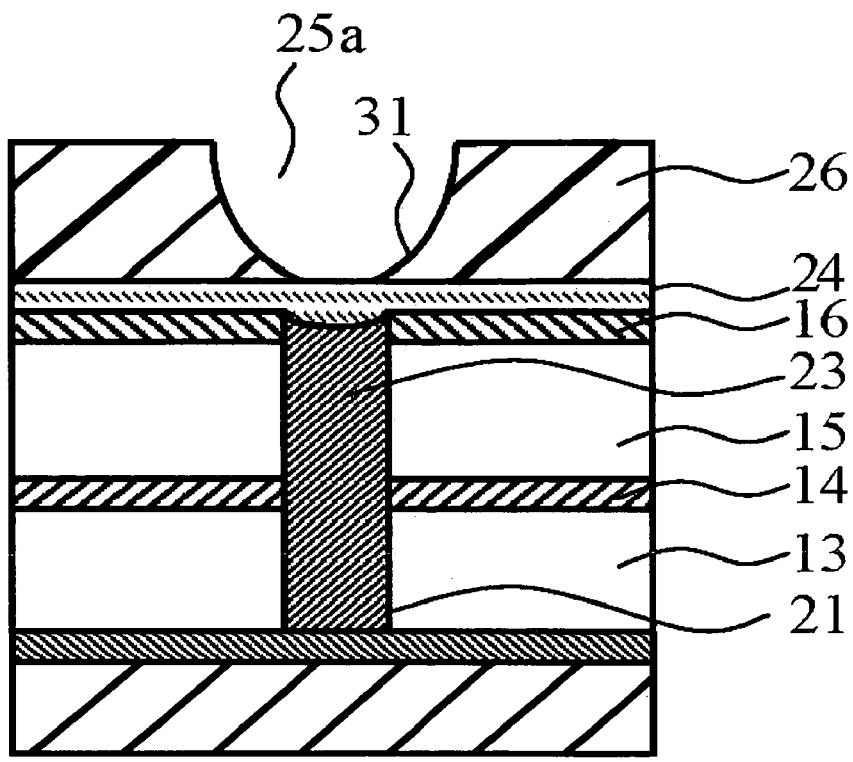
FIGS. 9A and 9B are cross-sectional views for explaining the problems of the present invention.

When the resist in the region around the trench opening 25 is not fully dissolved, in the case that a photo resist for ArF excimer laser exposure, for example, is irradiated with light and then developed, a developing failure is occurred as shown in FIG. 9A. Here, a remaining resist (scum) 31 is generated on the bottom of the trench opening 25a. If such scum is generated, fine and highly precise formation of the trench opening into an interconnect pattern becomes difficult.

Figure 9B:
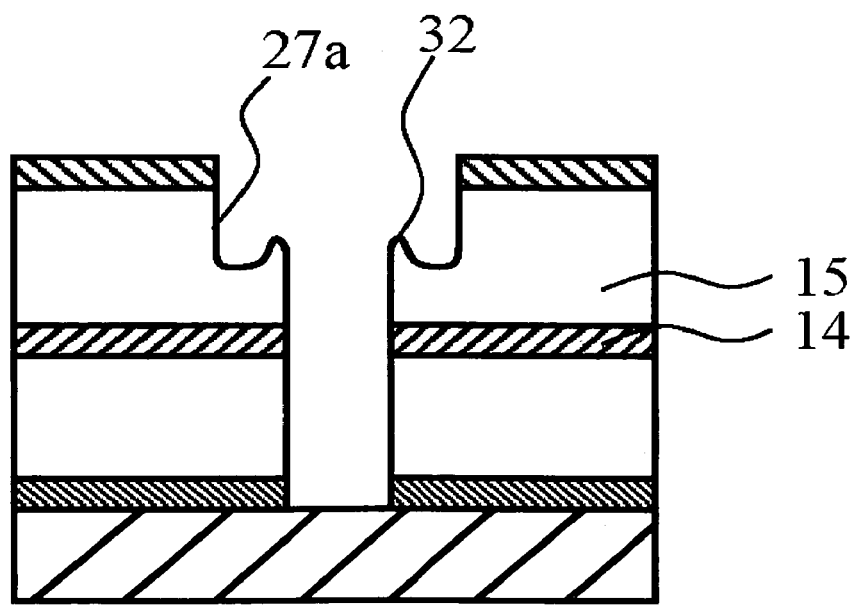

When the second anti-reflection coating 24, the cap layer 16 and the second low dielectric constant film 15 are then dry etched through a mask of the second resist mask 26 that contains such scum 31 generated thereon, an insufficient trench 27a that does not extend to a surface of a trench etch stop layer 14 is formed in the second low dielectric constant film 15, as shown in FIG. 9B. In addition, a crown-shaped fence 32 is easily formed along the circumference of the via hole.

Because of these reasons, it is difficult to form the trenches for dual damascene interconnects having fine structure and better quality and the dual damascene interconnect formed by plugging thereof with the interconnect material film, if the resist poisoning phenomenon occurs.

It is considered that the above-described resist poisoning phenomenon is caused because a basic substance of an alkaline component promotes a deactivation of an acid generation agent contained in a chemically amplified resist in a coating operation, a pre-baking operation, an exposure operation or a post exposure baking (PEB) operation for the chemically amplified positive (or negative) resist in the photolithography process.

According to the process for manufacturing the electronic device in the present embodiment, the resin film 1 may be composed of a material that functions capturing a basic substance as stated above, and a deactivation of the acid generation agent of the chemically amplified resist by a basic substance can be prevented. Having such configuration, the fine trench for the dual damascene interconnect having improved quality and the dual damascene interconnect formed by plugging thereof with the interconnect material film can be formed.

Figure 10:
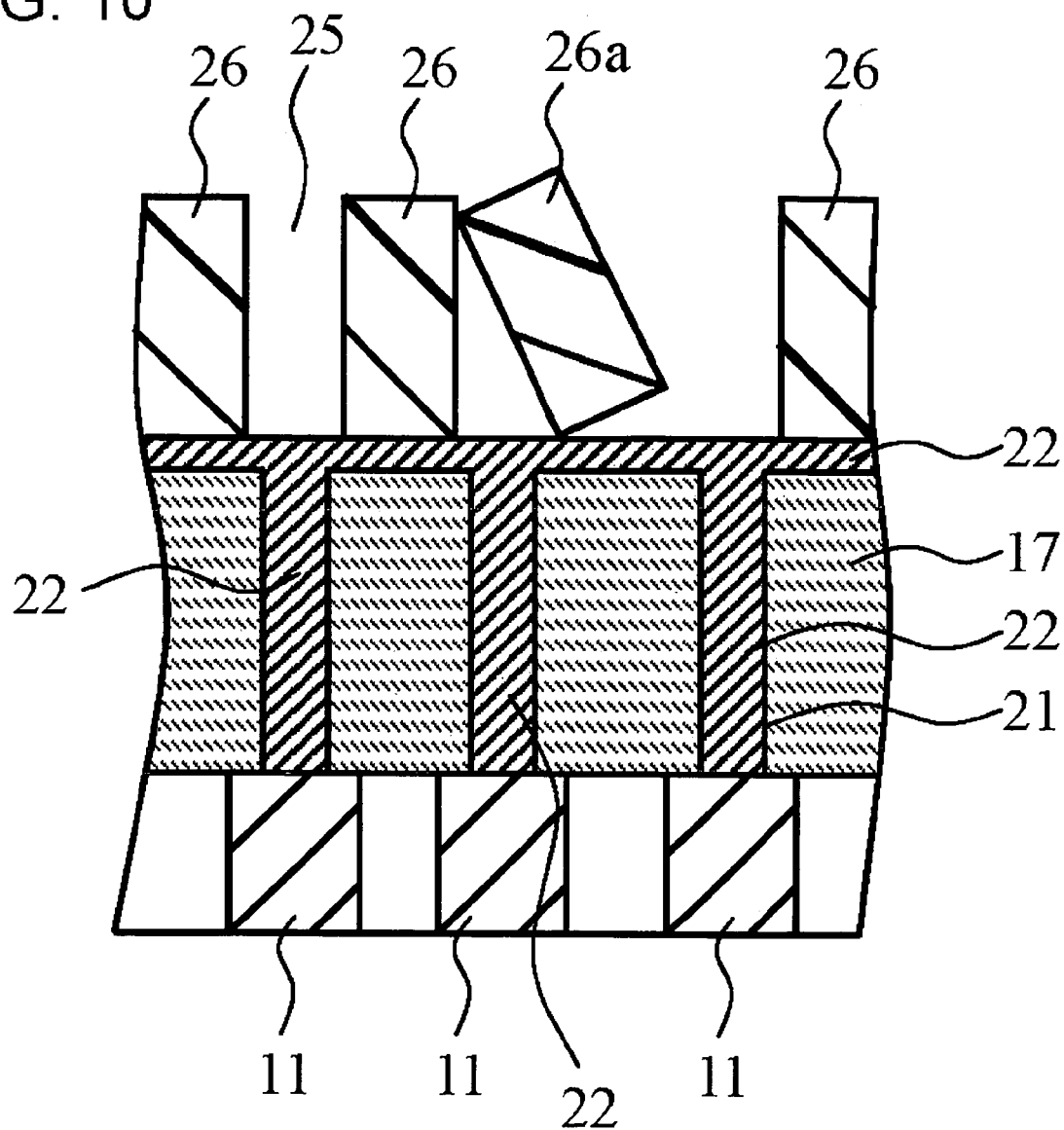
FIG. 10 is a cross-sectional view for explaining the problems of the present invention.

Next, in the process for forming the second resist mask 26 in the embodiment shown in FIG. 5C, a problem of a resist pattern-collapse is easy to be occurred. This will be described in reference to FIG. 10. In FIG. 10, same numeral is assigned to same element shown in FIG. 5C As shown in FIG. 10, interlayer insulating films 17 are formed on the underlying interconnects 11 that are mutually separated by insulating films. Subsequently, via holes 21 extending through the interlayer insulating film 17 to the surface of the underlying interconnect 11 are formed, and resin films 22 are formed on the surface of the interlayer insulating films 17 so as to plug the via holes 21 employing a coating process. Here, the resin film 22 may be composed of an organic polymer having thermosetting property such as novolac resin and the like. Subsequently, the resin films 22 are thermally treated to be cured, and thereafter, a chemically amplified resist is applied thereon. Subsequently, the chemically amplified resist is processed through a photolithographic process including pre-baking, exposing, post exposure baking (PEB), developing or the like to form the second resist mask 26 having an interconnect pattern.

In this case, a resist pattern-collapse may be occurred as illustrated by the second resist mask 26a shown in FIG. 10. Such resist pattern-collapse becomes more considerable, as increasing the level of the miniaturization of the interconnect dimension. When, for example, ratio of line/space (L/S) of an interconnect of 100 nm and an aspect ratio of the patterned resist is increased up to about 3, the collapse is easily occurred. It is considered that such resist collapse is caused by an adhesion of water onto an interface of the resin film 22 and the second resist mask 26 having a hydrophobicity in the above-described photolithographic process.

According to the manufacturing method of electronic device in the present embodiment, the resin film 1 may be composed of a material having a function of trapping a basic substance or of cellulosic resin, as described above, so that the resin film 1 can acquire a water-adsorbability. Thus, water existing at the interface between the resin film 1 and the second resist mask 26 can be removed to prevent the resist collapse.

EXAMPLES

Next, examples of the present invention will be described, and advantageous effects obtainable by employing the configurations according to the present invention will be more specifically described.

Example 1

Figure 6A:
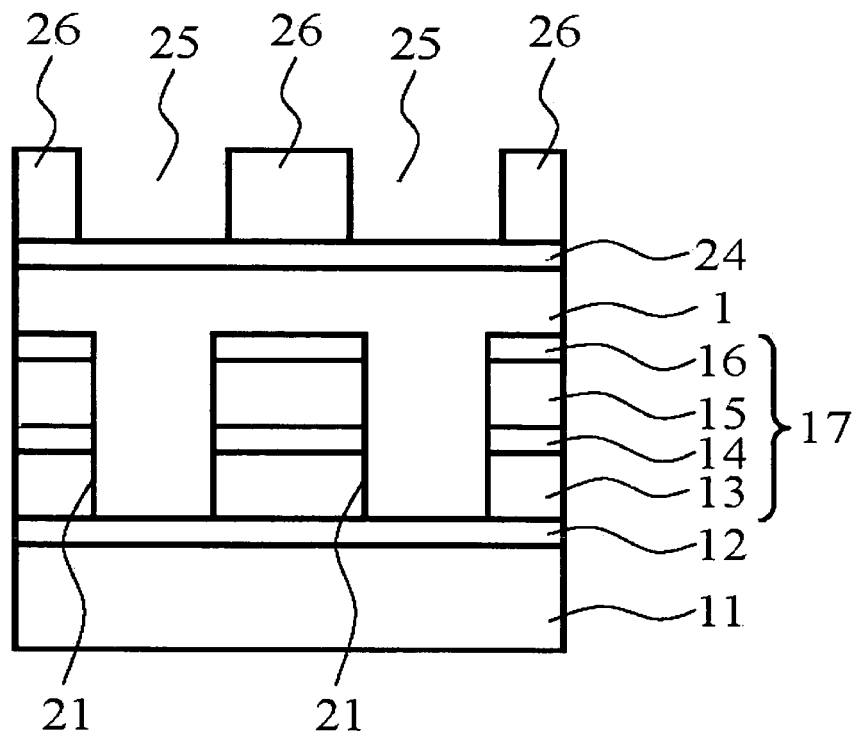
FIGS. 6A and 6B are a cross-sectional view of a device in an example 1 according to the present invention.
Figure 6B:
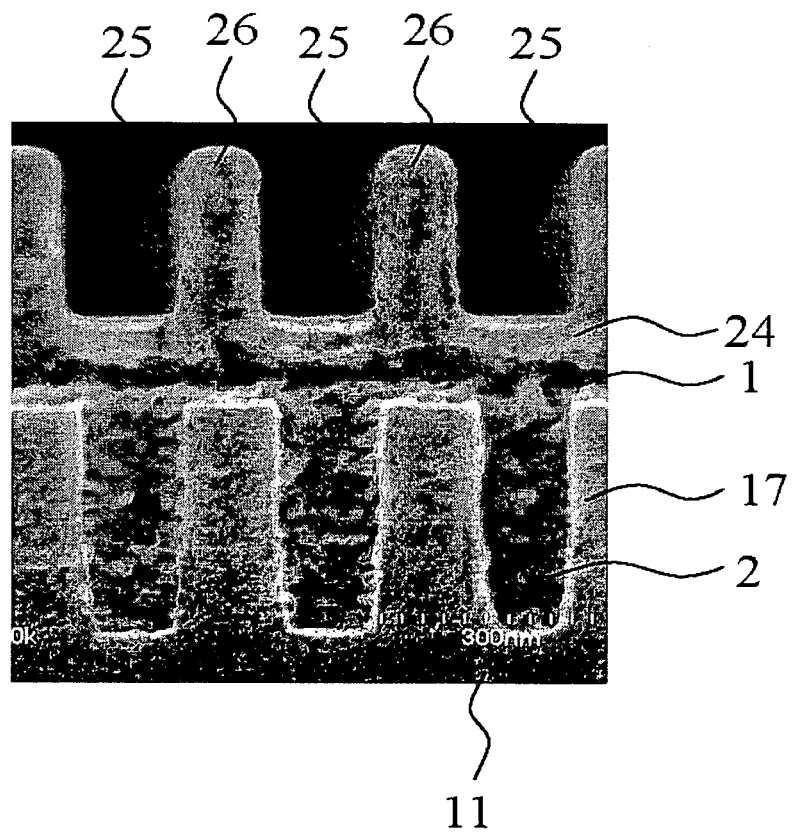

FIG. 6A is a cross-sectional view of a test element group (TEG) manufactured for a testing in example 1. FIG. 6B is a scanning electron microscope (SEM) structure of a cross-section thereof.

Figure 8A:
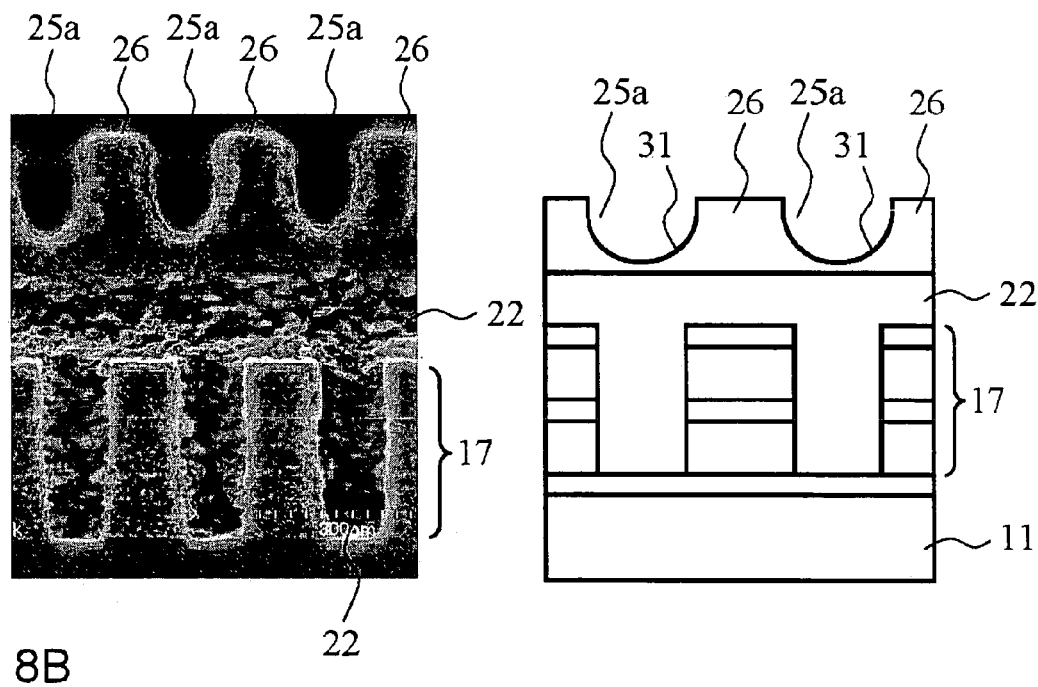
FIGS. 8A and 8B are cross-sectional views of a reference semiconductor device of a present invention.
Figure 8B:
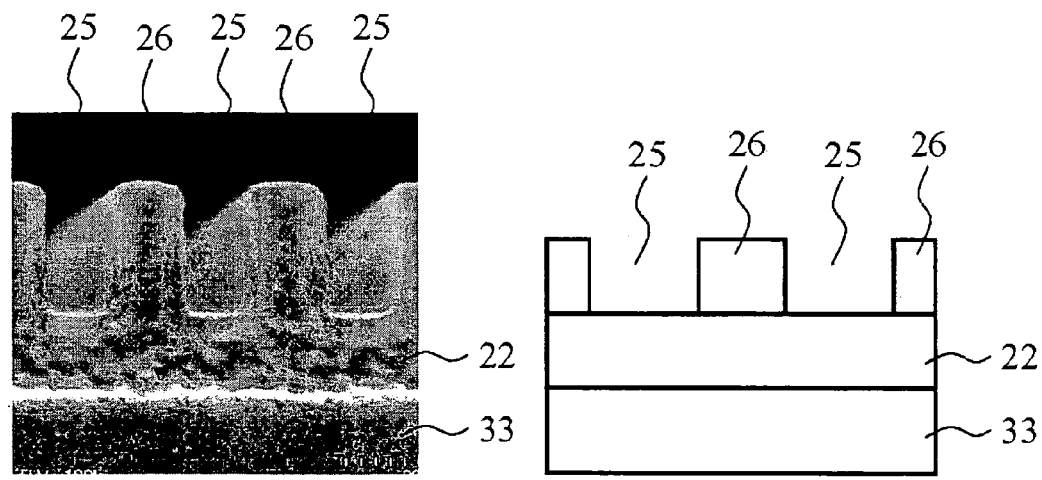

This shows the cross-sectional structure after the process of FIG. 5B, in which the dummy plug 2 was formed without conducting the etchback for the resin film 1. Here, same numeral is assigned to same element shown in FIG. 2A through FIG. 5C. In addition, FIGS. 8A and 8B illustrate similar cross-sectional structures shown as comparative examples.

As shown in FIG. 6A, a via etch stop layer 12, which functions as an insulating barrier layer, was formed on a surface of an underlying interconnect 11. The via etch stop layer 12 was composed of a SiCN film. Here, an anti-corrosion material, which had been formed of a coating film of benzotriazole (BTA) in the previous process, for example, was formed on the surface of the underlying interconnect 11 composed of Cu. As a process before a deposition of the SiCN film, ammonia ($NH_3$) gas is plasma-excited and is applied to remove the anti-corrosion material.

In the process for depositing the SiCN film, the substrate temperature was set to around 300 degree C., and an organosilane gas such as, for example, hexamethyldisilane, (($CH_3$)$_6$($Si$)$_2$), tetraethyl silane (($C_2H_5$)$_4Si$) and the like and ammonia gas were applied over the surface of the underlying interconnect 11. The SiCN film was deposited in this process. The SiCN film deposited by the above-described process exhibited sufficient function for preventing Cu diffusion, even if the film thickness thereof is equal to or less than 10 nm.

Next, a first low dielectric constant film 13 was formed of Aurora ULK (trademark) having a film thickness of about 120 nm as the low dielectric constant film. In addition, a trench etch stop layer 14 was formed of a SiC film having a film thickness of about 20 nm. Further, a second low dielectric constant film 15 was formed of Aurora ULK (trademark) having a film thickness of about 150 nm. Then, the cap layer 16 was formed of a $SiO_2$ film having a film thickness of about 100 nm. Having theses configurations, an interlayer insulating film 17 of a multi-layer structure was formed. Then, via holes 21 extending to the surface of the via etch stop layer 12 were formed in this interlayer insulating film 17 with an arranged interval therebetween of 280 nm.

Subsequently, the surface of the interlayer insulating film 17 was coated with a resin film 1, which had been manufactured by employing cellulose having a chemical structure shown in FIG. 1 as a basic material and further adding methyl acetate thereto as an acidic agent so as to plug the via holes 21. Here, the film thickness of the resin film 1 was set to about 150 nm. Further, after coating and forming the resin film 1, the resin film was baked to carbonize at a temperature of 200 degree C.

Next, an acrylic anti-reflection film having a film thickness of 40 nm was applied on the surface of the resin film 1 to form a first anti-reflection film 24. Then, a photolithographic process including applying a chemically amplified positive resist, pre-baking, exposing, post exposure baking (PEB), developing and the like was conducted to form the second resist mask 26 having an interconnect pattern.

The process for removing the above-described anti-corrosion material or the process for forming the via etch stop layer 12 involved a condition that promoted generating larger quantity of basic substances, as described later in reference to a comparative example shown in FIGS. 8A and 8B. Even though such condition was involved, no remaining resist was found in the trench opening 25 formed in the second resist mask 26, as shown in FIG. 6B, by employing the resin film 1 manufactured by employing cellulose as the basic material and further adding methyl acetate thereto as an acidic agent. This indicates that the above-described resin film 1 traps or neutralizes the basic substance such as amine, thereby effectively inhibiting the resist poisoning phenomenon.

On the contrary, in a comparative example shown in FIG. 8A, in which a formation process was completely-similarly conducted under a condition of generating larger amount of the basic substance, a remaining resist (scum) 31 was considerably generated by a resist poisoning phenomenon in the trench opening 25a of the second resist mask 26. Here, the resin film 22 that plugged the via holes 21 were composed of a phenolic resin having an anti-reflective function. Other portions thereof having same numeral numbers were same as the respective elements shown in FIGS. 6A and 6B. In this case, larger quantity of basic substances such as amine generated particularly in the process for removing the anti-corrosion material from the surface of the underlying interconnect 11 or the process for depositing the via etch stop layer 12 could not be sufficiently trapped by the resin film 22, and the untrapped basic substances deactivated the acid generation agent contained in the chemically amplified positive resist in the process for forming the second resist mask 26. FIG. 8B is presented in order to describe the situation, and is a cross-sectional view, illustrating a device that was formed by applying the above-described resin film 22 over the silicon substrate 33, applying the same chemically amplified positive resist thereon, and further forming the second resist mask 26 through the same photolithographic process. In this case, no remaining resist (scum) was occurred. As such, the basic substances that caused the above-described resist poisoning phenomenon was generated in the process for forming the dual damascene interconnect as stated above.

As described in reference to FIGS. 4A to 4C, the second resist mask 26, the second anti-reflection film 24 and the dummy plug 23 were removed by an ashing process, and the exposed via etch stop layer 12 was dry etched by a dry etching process through the hard mask of the cap layer 16 and the trench etch stop layer 14 to form the trench 28 for the dual damascene interconnect extending to the surface of the underlying interconnect 11. Then, a process for depositing the barrier metal of tantalum (Ta) film and TaN film by an ALD process, a process for forming Cu seed, and a process for plating Cu were carried out to form the interconnect material film that was an electric conductor film, and then a CMP process was carried out to remove unwanted portions of the above-described interconnect material film on the surface of cap layer 16. As such, the dual damascene interconnect 30 was formed.

Example 2

Figure 7A:
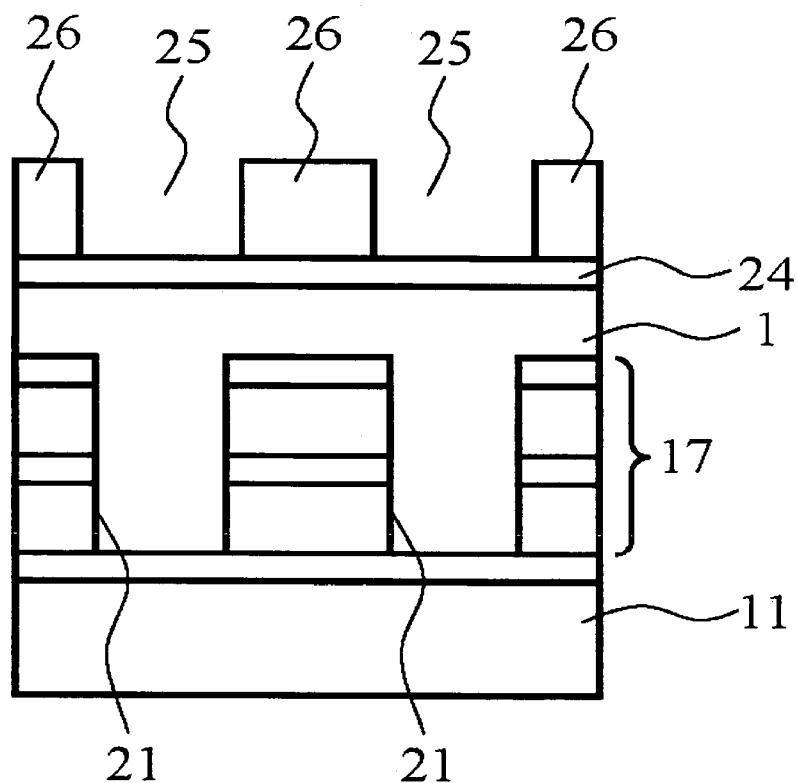
FIGS. 7A and 7B are a cross-sectional view of a device in an example 1 according to the present invention.
Figure 7B:
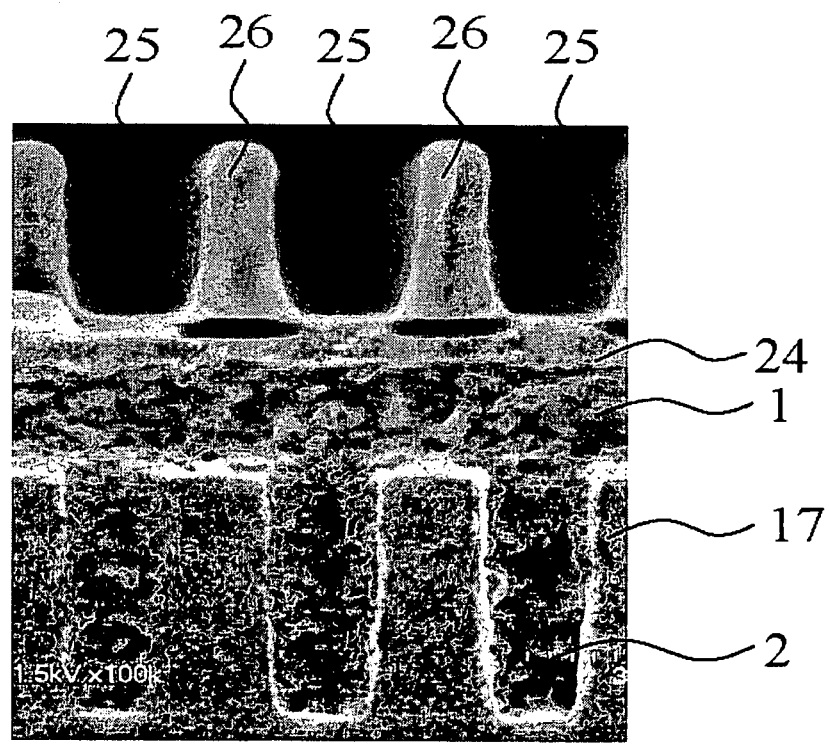

Next, second example of the present invention will be described in reference to FIGS. 7A and 7B. FIG. 7A is also a cross-sectional view of a test element group (TEG) manufactured similarly as in the example shown in FIG. 6A. FIG. 7B is a scanning electron microscope (SEM) structure of a cross-section thereof. In case of example 2, the employed resin film 1 is different from that shown in FIG. 6A. The major difference therebetween is that no acidic agent is added to the resin film 1. Other configurations are same as that presented in FIG. 6A, as shown in FIG. 7A. Consequently, the following description focuses on the different points from the case of example 1. In this case, a resin film 1 containing a cellulose having a film thickness of 250 nm as a basic material was applied, and then, baked to be carbonized within nitrogen gas at 210 degree C.

Although a small hem-like bottom was generated in the bottom of the trench opening 25 formed in the second resist mask 26 in example 2, as shown in FIG. 7B, the difference is considerable as compared with a case of a comparative example shown in FIG. 8A, and in this case, the advantageous effect of inhibiting the resist poisoning is also considerably exhibited.

In addition, in another investigation, investigation of the resist collapse was conducted by hydroxyl group (OH group) of cellulose employed for the resin film 1 with alkyl group (methyl group or ethyl group) and by selecting various levels of hydrophobicity of the cellulosic resin, and as a result, it was found that the highest level of the resist-collapse resistance was obtained in a case that hydroxyl group of cellulosic resin was not substituted with alkyl group.

As described above, in the embodiment of the present invention, the interior of the via hole was plugged with the resin film that is capable of trapping a basic substance in the process for forming the dual damascene interconnect employing the via first process. Alternatively, the via hole is plugged with the resin film formed of a cellulose as a constitutional material. Having such configuration, basic substances such as amine created in the process for forming the dual damascene interconnect can be trapped by such type of resin or the dummy plug formed of such type of resin, thereby providing an inhibition in the above-described resist poisoning phenomenon. Further, a fine trench opening 25 can be stably formed with higher reproducibility without creating scum that is a remaining resist.

Further, as specifically described in the examples, larger quantity of NH, $NH_2$ and $NH_3$ that are basic materials are generated by the plasma-excitation of ammonia gas, or the plasma-excitation of a gaseous mixture of hydrogen and nitrogen in the process for forming the above-described dual damascene interconnect, and even though these basic materials or amines bounded to an alkyl group are incorporated as basic substances into the material film used for forming the above-described interconnect, these basic substances can be easily trapped by the resin film or by the dummy plug formed thereof according to the above embodiments. Thus, plasma-excitation of the gaseous mixture of hydrogen and nitrogen can be employed in the process for forming the above-described dual damascene interconnect, as well as gases such as ammonia gas, and thus a process flexibility in the process for forming the interconnect can be increased.

In addition, a water absorption of the resin film is increased by employing a cellulose and baking the cellulose to carbonize thereof. Therefore, an adhesiveness of the second resist mask formed in a shape of an interconnect pattern with the second anti-reflection film underlying thereof or the resin film is considerably improved. Thus, the resist pattern-collapse resistance is considerably improved.

In this way, in the exemplary configuration according to the present invention, the problem of the resist poisoning can be eliminated and further miniaturization of the dual damascene interconnect can be facilitated, thereby promoting an increased operation speed of the semiconductor device. In addition, the problem of the resist collapse can also be eliminated to provide a stable production of the long and narrow trench 25 having a shape of an interconnect pattern, and the increased level of the process flexibility promotes an improved production yield of the semiconductor device, thereby reducing the manufacturing cost for the semiconductor device comprising the dual damascene interconnect structure.

While the preferable embodiment of the present invention has been described as described above, it is not intended to limit the scope of the present invention to the embodiment described. It is possible for a person having ordinary skills in the art to modify and/or change the specific embodiments in various ways without departing from the scope and the spirits of the present invention.

In the present invention, an advantageous effect described above can be obtained by applying a cellulose material in the resin film employed for forming the dummy plug. In this case, various forms are available for the resin film including the above-described cellulose, and as the resin film for the above-described trapping, wide range of the resin compositions from the resin composition containing and mixed the above-described cellulose as a part of the composition to the resin composition containing the cellulose as a main component can be applied.

In addition to the above-described cellulosic resin film, resin compositions composed of materials that are capable of trapping a basic substance may also be similarly employed for the resin film employed for forming the dummy plug. As a basic material of such resin film, a material containing hydroxyl group, similarly as cellulose contains, is preferable. Alternatively, a material of a base resin may also similarly be applicable, provided that the material of the base resin easily produces dipole having H+ therein, for example.

Further, the present invention may also similarly be applicable to a case of employing a chemically amplified negative resist in the process for forming the above-described resist mask having the trench opening, in place of employing the chemically amplified positive resist.

In addition, a damascene interconnect having other electric conductor film plugged therein may also be formed, in stead of plugging the above-described via hole or trench with Cu or Cu alloy. In this case, a refractory metal film such as a tungsten (W) film and the like, or a gold (Au) film may be employed for the electric conductor film.

In addition, while the case of employing the low-k film as the interlayer insulating film between interconnects has been mainly described in the above-described embodiment, it is not intended to limit the scope of the present invention to such insulating film, and the present invention may equally be applicable to cases where the interlayer insulating film is formed with an insulating film such as a silicon oxide film, a silicon nitride film, a silicon oxynitride film and the like.

Further, it should be noted that the present invention is not particularly limited to the case where the dual damascene interconnect is formed on the semiconductor substrate such as the silicon semiconductor substrate, the compound semiconductor substrate and the like. Alternatively, the present invention may also equally be applicable to cases where the interlayer insulating film is formed on a liquid crystal display substrate composing a display device or a plasma display substrate.

The present invention also includes the following configuration.

(1) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;

forming a resin film on said interlayer insulating film so as to plug said via hole, said resin film being capable of trapping a basic substance;

etching the resin film on said interlayer insulating film off via a dry etching process of said resin film to form a dummy plug composed of said resin film in said via hole;

forming a resist mask having an opening for an interconnect on said dummy plug and on said interlayer insulating film; and etching said interlayer insulating film via a dry etching process through an etching mask of said resist mask to form a trench for said interconnect, said trench being connected with said via hole.

(2) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;

forming a resin film on said interlayer insulating film so as to plug said via hole, said resin film containing cellulose;

etching the resin film on said interlayer insulating film off via a dry etching process of said resin film to form a dummy plug composed of said resin film in said via hole;

forming a resist mask having an opening for an interconnect on said dummy plug and on said interlayer insulating film; and etching said interlayer insulating film via a dry etching process through an etching mask of said resist mask to form a trench for said interconnect, said trench being connected with said via hole.

(3) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;
forming a resin film on said interlayer insulating film so as to plug said via hole, said resin film being capable of trapping a basic substance;
forming a resist mask having an opening for an interconnect on said resin film; and
etching said interlayer insulating film via a dry etching process through an etching mask of said resist mask to form a trench for said interconnect, said trench being connected with said via hole.

(4) A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;
forming a resin film on said interlayer insulating film so as to plug said via hole, said resin film containing cellulose;
forming a resist mask having an opening for an interconnect on said resin film; and
etching said interlayer insulating film via a dry etching process through an etching mask of said resist mask to form a trench for said interconnect, said trench being connected with said via hole.

It is apparent that the present invention is not limited to the above embodiment, that may be modified and changed without departing from the scope and spirit of the invention.

What is claimed is:

1. A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;
forming a resin film on said interlayer insulating film, said resin film plugging said via hole, and being capable of trapping a basic substance;
forming a resist mask having an opening for an interconnect on said interlayer insulating film; and
etching said interlayer insulating film through said resist mask to form a trench for said interconnect, said trench being connected with said via hole, wherein an acidic agent is added to said resin film.

2. The method according to claim 1, further comprising forming a dummy plug composed of said resin film in said via hole by etching a portion of said resin film exposed outside said via hole off before said forming the resist mask, wherein, in said forming the resist mask, said resist mask is formed on said dummy plug and on said interlayer insulating film.

3. The method according to claim 1, wherein a resist mask having an opening for an interconnect is formed on said resin film in said forming the resist mask, and wherein said resin film and said interlayer insulating film are dry-etched through an etching mask of said resist mask in said forming the trench for the interconnect.

4. The method according to claim 1, wherein said resin film includes cellulose.

5. The method according to claim 2, wherein said resin film includes cellulose.

6. The method according to claim 3, wherein said resin film includes cellulose.

7. A method for manufacturing an electronic device, in which a via hole and a trench for an interconnect are integrally provided in an interlayer insulating film formed on a substrate, and said via hole and the trench for the interconnect are plugged with an electric conductor film, comprising:

forming an etch stop layer on said substrate;
forming said interlayer insulating film on said etch stop layer;
forming a via hole in said interlayer insulating film;
forming a resin film on said interlayer insulating film, said resin film plugging said via hole, and containing cellulose;
forming a resist mask having an opening for an interconnect on said interlayer insulating film;
etching said interlayer insulating film through said resist mask to form a trench for said interconnect, said trench being connected with said via hole;
removing said resist mask and said resin film using a first process; and
removing said etch stop layer using a second process different from said first process.

8. The method according to claim 7, further comprising forming a dummy plug composed of said resin film in said via hole by etching a portion of said resin film exposed outside said via hole off before said forming the resist mask, wherein, in said forming the resist mask, said resist mask is formed on said dummy plug and on said interlayer insulating film.

9. The method according to claim 7, wherein a resist mask having an opening for an interconnect is formed on said resin film in said forming the resist mask, and wherein said resin film and said interlayer insulating film are dry-etched through an etching mask of said resist mask in said forming the trench for the interconnect.

10. The method according to claim 4, further comprising thermally processing said resin film within an inert gas or hydrogen gas after forming said resin film to carbonize at least a portion thereof.

11. The method according to claim 7, further comprising thermally processing said resin film within an inert gas or hydrogen gas after forming said resin film to carbonize at least a portion thereof.

12. A method for manufacturing an electronic device, in which a via hole and a trench for an interconnect are integrally provided in an interlayer insulating film formed on a substrate, and said via hole and the trench for the interconnect are plugged with an electric conductor film, comprising:

forming a via hole in said interlayer insulating film;
forming a resin film on said interlayer insulating film, said resin film plugging said via hole, and containing cellulose;
thermally processing said resin film within an inert gas or hydrogen gas after forming said resin film to carbonize at least a portion thereof;
forming a dummy plug composed of said resin film in said via hole by etching a portion of said resin film exposed outside said via hole;
forming a resist mask having an opening for an interconnect on said interlayer insulating film, said resist mask is formed on said dummy plug and on said interlayer insulating film; and etching said interlayer insulating film through said resist mask to form a trench for said interconnect, said trench being connected with said via hole.

13. The method according to claim 9, further comprising thermally processing said resin film within an inert gas or hydrogen gas after forming said resin film to carbonize at least a portion thereof.

14. The method according to claim 7, wherein an acidic agent is added to said resin film.

15. The method according to claim 1, wherein said resin film is removed by conducting a dry etching process employing an active hydrogen species that is composed of hydrogen plasma or hydrogen radical as an etching gas in said forming the dummy plug.

16. The method according to claim 7, wherein said resin film is removed by conducting a dry etching process employing an active hydrogen species that is composed of hydrogen plasma or hydrogen radical as an etching gas in said forming the dummy plug.

17. The method according to claim 1, further comprising forming an anti-reflection film on said interlayer insulating film before said forming the resist mask, wherein said resist mask is formed on said anti-reflection film in said forming said resist mask.

18. The method according to claim 7, further comprising forming an anti-reflection film on said interlayer insulating film before said forming the resist mask, wherein said resist mask is formed on said antireflection film in said forming said resist mask.

* * * * *